United States Patent
Moon

(10) Patent No.: US 8,372,727 B2
(45) Date of Patent: *Feb. 12, 2013

(54) METHOD FOR FABRICATING LIGHT EMITTING DEVICE

(75) Inventor: Yong Tae Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/240,965

(22) Filed: Sep. 22, 2011

(65) Prior Publication Data

US 2012/0015466 A1   Jan. 19, 2012

Related U.S. Application Data

(63) Continuation of application No. 12/712,584, filed on Feb. 25, 2010, now Pat. No. 8,039,362.

(30) Foreign Application Priority Data

Feb. 25, 2009  (KR) ........................ 10-2009-0016020

(51) Int. Cl.
*H01L 21/30* (2006.01)
(52) U.S. Cl. .................. 438/458; 257/E21.57
(58) Field of Classification Search .................. 438/22, 438/458; 257/E21.57, E21.6
See application file for complete search history.

(56) References Cited

U.S. PATENT DOCUMENTS

| 7,524,692 | B2 | 4/2009 | Park et al. |
| 8,039,362 | B2 * | 10/2011 | Moon ........................... 438/458 |
| 2005/0110037 | A1 | 5/2005 | Takeda et al. |
| 2006/0194360 | A1 | 8/2006 | Takeuchi et al. |
| 2006/0246614 | A1 | 11/2006 | Suh |
| 2006/0286777 | A1 | 12/2006 | Lee et al. |
| 2008/0042244 | A1 | 2/2008 | Anzue et al. |
| 2009/0212278 | A1 | 8/2009 | Jorgenson et al. |
| 2010/0264442 | A1 | 10/2010 | Lee |

FOREIGN PATENT DOCUMENTS

| JP | 2005-175462 A | 6/2005 |
| KR | 10-0730537 A | 12/2005 |
| KR | 10-2007-0089764 A | 9/2007 |

* cited by examiner

*Primary Examiner* — Quoc Hoang
(74) *Attorney, Agent, or Firm* — Birch, Stewart, Kolasch & Birch, LLP

(57) ABSTRACT

Provided is a method for fabricating a light emitting device. The method includes forming a gallium oxide layer; forming a first conductive type semiconductor layer, an active layer, and a second conductive type semiconductor layer on the gallium oxide layer; forming a non-conductive substrate on the second conductive type semiconductor layer; separating the gallium oxide layer forming a conductive substrate on the first conductive type semiconductor layer; and separating the non-conductive substrate.

7 Claims, 6 Drawing Sheets

[Figure 1]
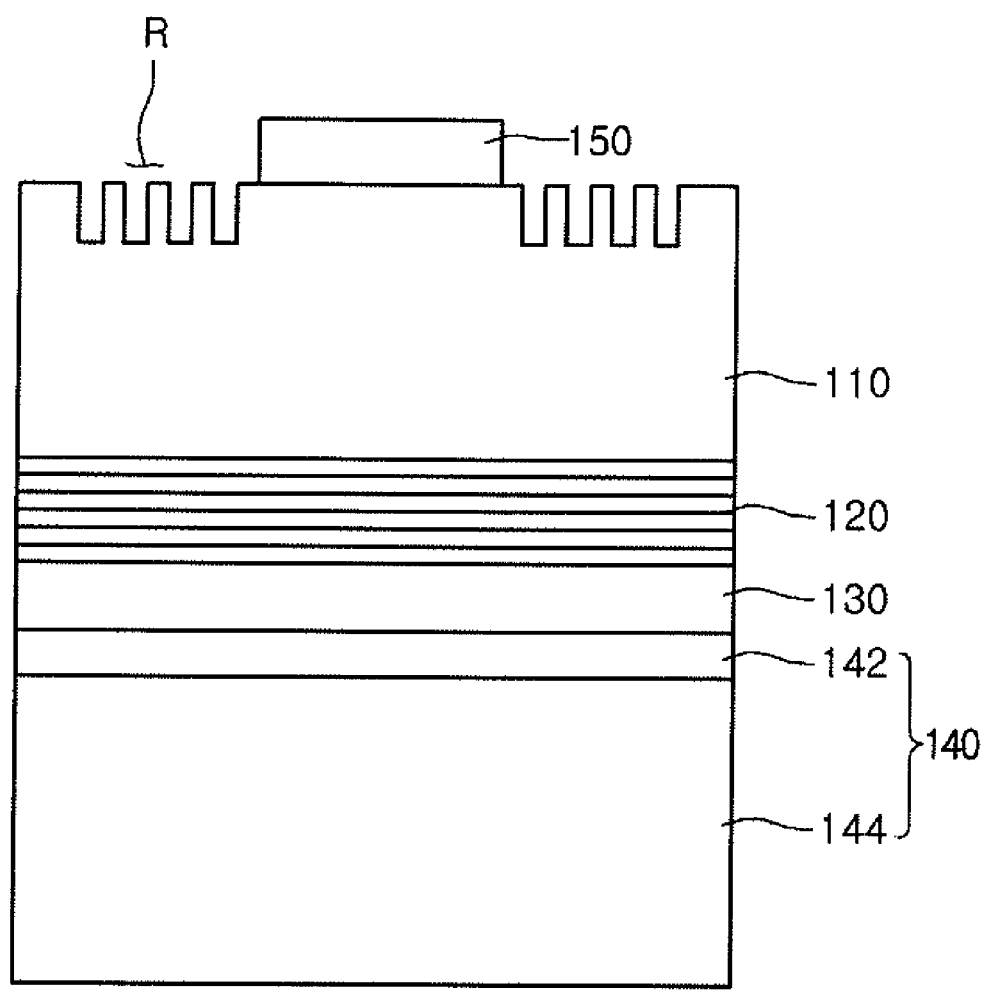

[Figure 2]
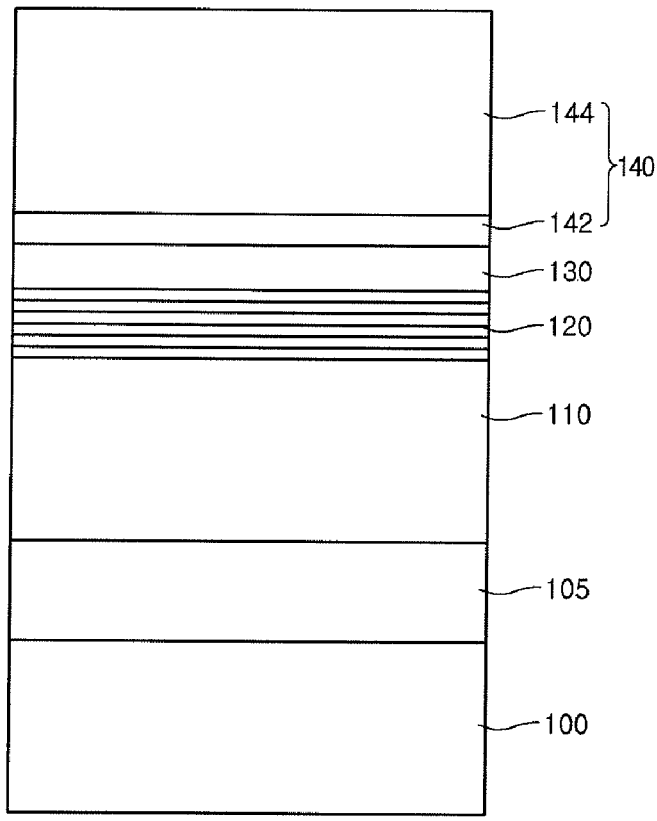
[Figure 3]
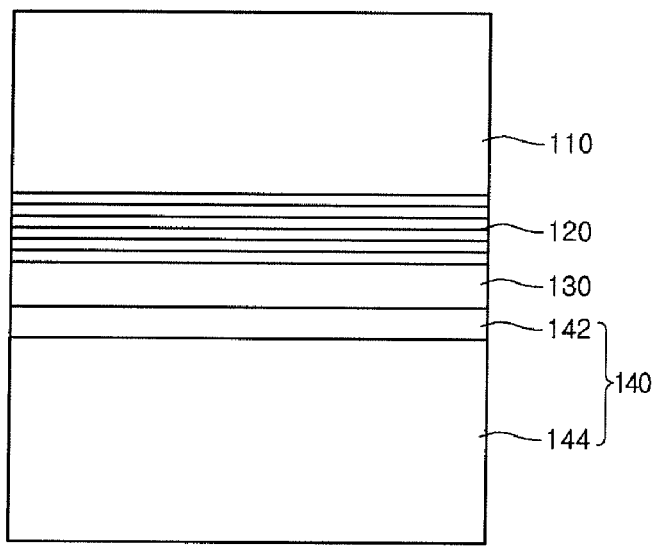

[Figure 4]
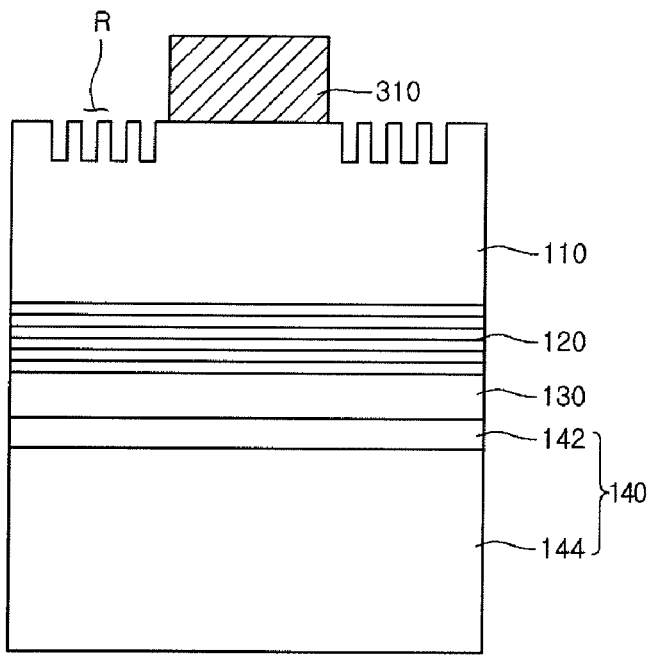
[Figure 5]
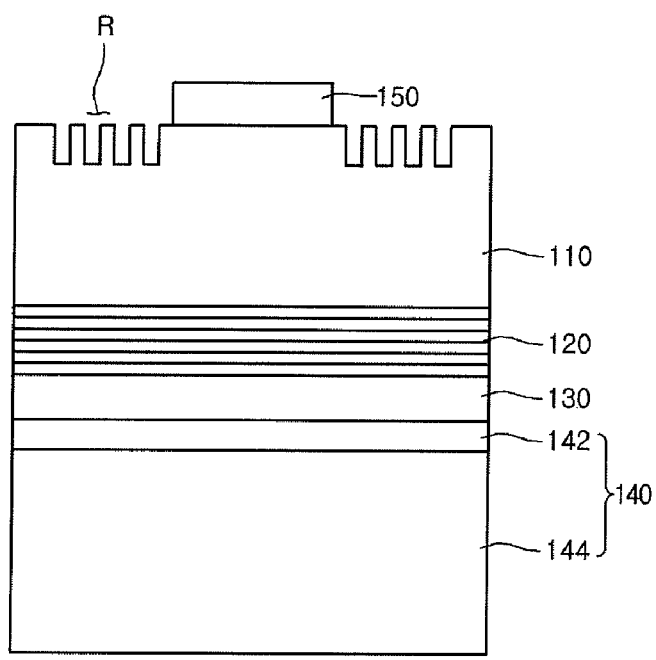

[Figure 6]
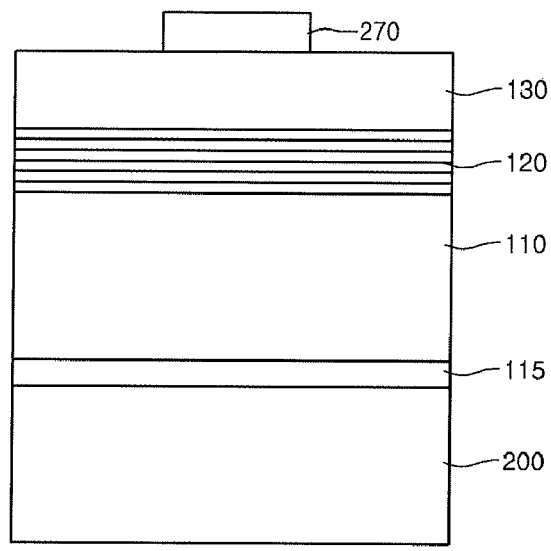
[Figure 7]
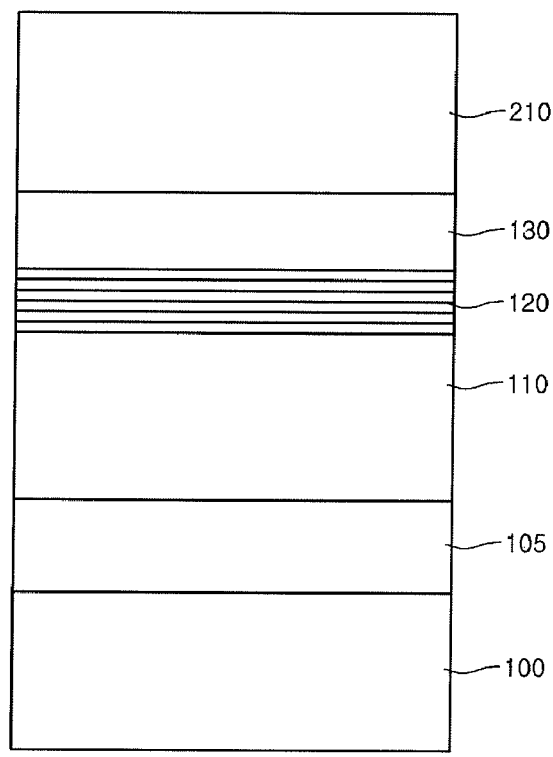

[Figure 8]
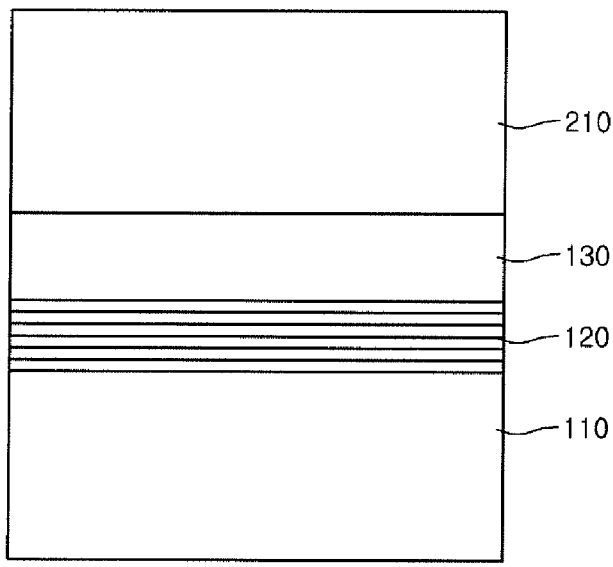
[Figure 9]
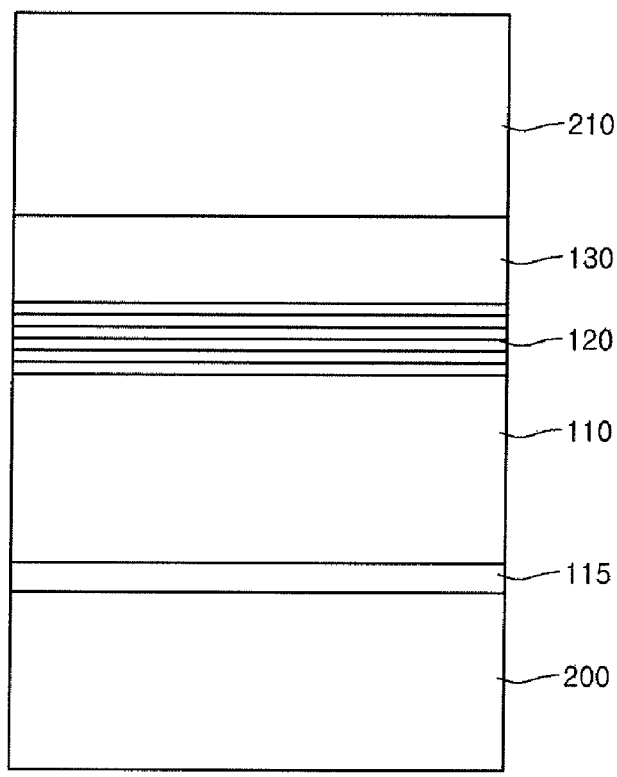

[Figure 10]
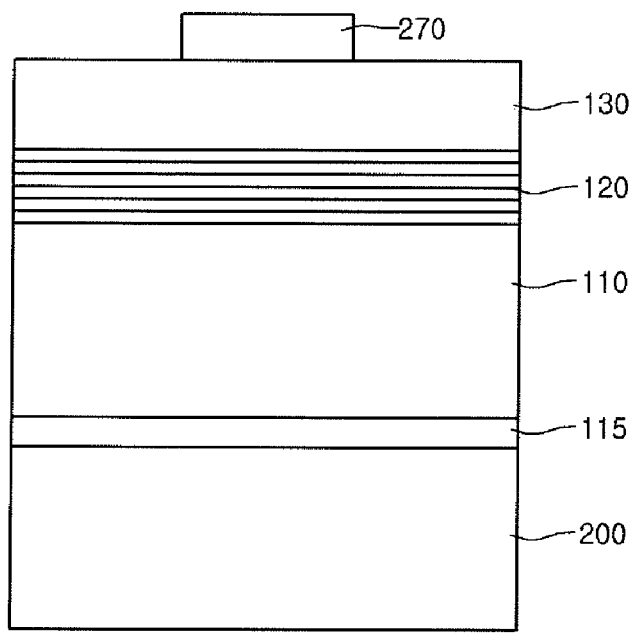
[Figure 11]
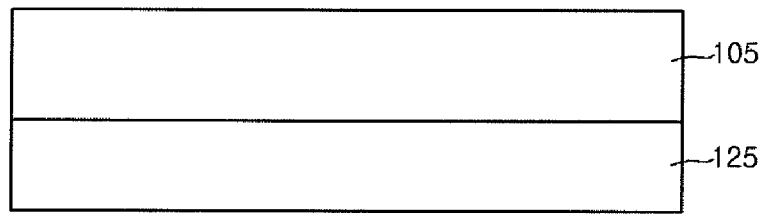
[Figure 12]
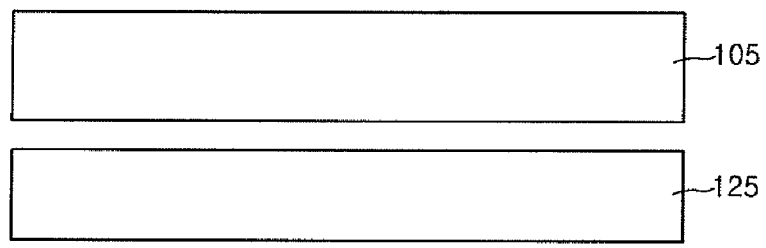

METHOD FOR FABRICATING LIGHT EMITTING DEVICE

CROSS-REFERENCE TO RELATED APPLICATION

This application is a continuation of U.S. application Ser. No. 12/712,584 filed on Feb. 25, 2010 now U.S. Pat. No. 8,039,362 claiming the benefit of Korean Patent Application No. 10-2009-0016020 filed Feb. 25, 2009, both of which are hereby incorporated by reference for all purpose as if fully set forth herein.

BACKGROUND

Embodiments relate to a method for fabricating a light emitting device.

Nitride semiconductors are attracting much attention for the fields of optical devices and high-power electronic devices because of their high thermal stability and wide band gap energy. In particular, blue light emitting devices (LEDs), green LEDs, and UV LEDs that use nitride semiconductors have been commercialized and are being widely used.

Nitride semiconductor LEDs commercialized in recent years include a nitride semiconductor layer, which is organic-chemically deposited over a sapphire substrate that is a heterogeneous substrate. A gallium nitride (GaN) substrate having the same material as a nitride semiconductor thin film is too expensive. Thus, it is difficult to commercially utilize the GaN substrate. The sapphire substrate widely used in recent years has an electrically insulating characteristic. Thus, a nitride semiconductor LED formed on the sapphire substrate has a lateral type structure in which cathode and anode metal pads are formed in one direction of the substrate.

Generally, a lateral type LED structure has a limitation in which a portion of a light emitting layer should be etched to form a negative electrode. Also, since the electrodes are disposed on one side of the substrate, current is not uniformly injected into the light emitting layer when the current is injected. Such un-uniform injection of the current deteriorates electronic reliability and light emission efficiency.

BRIEF SUMMARY

Embodiments provide a method for fabricating a light emitting device in which a nitride semiconductor thin film can be effectively separated from a substrate In one embodiment, a method for fabricating a light emitting device (LED) comprises: forming a gallium oxide layer; forming a first conductive type semiconductor layer, an active layer, and a second conductive type semiconductor layer on the gallium oxide layer; forming a second electrode layer on the second conductive type semiconductor layer; and separating the gallium oxide layer.

In another embodiment, a method for fabricating a light emitting device (LED) comprises: forming a gallium oxide layer; forming a first conductive type semiconductor layer, an active layer, and a second conductive type semiconductor layer on the gallium oxide layer; forming a non-conductive substrate on the second conductive type semiconductor layer; separating the gallium oxide layer forming a conductive substrate on the first conductive type semiconductor layer; and separating the non-conductive substrate.

In further another embodiment, a method for fabricating a light emitting device (LED) comprises: forming a gallium oxide layer; forming a nitride semiconductor layer on the gallium oxide layer; separating the gallium oxide layer.

BRIEF DESCRIPTION OF THE DRAWINGS

FIG. 1 is a sectional view of a light emitting device (LED) according to a first embodiment.

FIGS. 2 to 5 are sectional views of a method for fabricating the LED according to the first embodiment.

FIG. 6 is a sectional view of a light emitting device (LED) according to a second embodiment.

FIGS. 7 to 10 are sectional views of a method for fabricating the LED according to the second embodiment.

FIGS. 11 to 12 are sectional views of a method for fabricating an LED according to a third embodiment.

DETAILED DESCRIPTION OF THE EMBODIMENTS

In the descriptions of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. Also, it will be understood that when a layer is referred to as being 'on' or 'under' another layer, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

(First Embodiment)

FIG. 1 is a sectional view of a light emitting device (LED) according to a first embodiment.

A light emitting device (LED) according to a first embodiment may include a second electrode layer 140, a second conductive type semiconductor layer 130 disposed on the second electrode layer 140, an active layer 120, and a first conductive semiconductor layer 110. The first embodiment may include a roughness R disposed on the first conductive type semiconductor layer 110, but is not limited thereto.

Gallium oxide ($Ga_2O_3$) has an energy band gap of about 4.8 eV. Also, gallium oxide is transparent and has superior conductivity. Electrons such as aluminum (Al) and indium (In) may be mixed with gallium oxide to easily adjust the band gap and physical and chemical properties of gallium oxide. Gallium oxide has a monoclinic structure. Thus, it may be possible to grow a superior nitride semiconductor thin film on a gallium oxide substrate.

In particular, gallium oxide having the monoclinic crystal structure has a cleavage characteristic that is a proper characteristic of a material with respect to a (100) or (001) crystallographic plane. The cleavage characteristic represents a property in which a crystalline material is split into pieces using a specific crystallographic plane as a boundary. In a crystal structure in which atoms are stacked in a certain rule, when a face-to-face coupling force between specific crystallographic atom planes is very weaker than that between other crystallographic atom planes, the cleavage occurs along a corresponding crystal plane. The crystal cleavage may easily occur in any direction parallel to the crystallographically same cleavage surface.

According to a method for fabricating the LED according to this embodiment, since the thin film is separated using the proper cleavage characteristic of a crystal material of gallium oxide, a high-quality nitride semiconductor thin film having economical, simplified, and mass-productive characteristics may be fabricated.

Also, the nitride semiconductor LED fabricated using a method for fabricating the LED according to this embodiment may be greatly contributed in realization of a vertical type nitride semiconductor LED having high power, high efficiency, and high reliability.

Hereinafter, a method for fabricating an LED according to the first embodiment will be described with reference to FIGS. 2 to 5.

As shown in FIG. 2, a first substrate 100 is prepared. A substrate having a crystallographical structure that may form a nitride semiconductor ($Al_xIn_yGa1-x-yN$ ($0 \leqq x,y \leqq 1$)) thin film may be fundamentally used as the first substrate 100. For example, the first substrate 100 may be formed of sapphire, Si, and SiC, or gallium oxide ($Ga_2O_3$), GaN, and AlN, or other metal oxides, but is not limited thereto.

The preparing of the first substrate 100 may include cleaning a surface of the first substrate 100 using chemical wet cleaning or oxygen, nitrogen, or a mixed gas thereof at a high temperature.

A gallium oxide layer 105 using a (100) or (001) crystallographic plane having a cleavage characteristic as a growth surface is formed on the first substrate 100. A thin film of the gallium oxide layer 105 may be deposited using a thin film deposition method. For example, chemical vapor deposition or sputtering may be used as the thin film deposition method.

In case of a gallium oxide single crystal substrate in which a surface thereof has a crystallographic cleavage characteristic such as the (100) or (001) crystallographic plane, the thin film of the gallium oxide layer 105 may not be deposited.

A gallium metal may be deposited on the first substrate 100, and then thermally oxidized at a high temperature to form the thin film of the gallium oxide layer 105. The gallium oxide thin film disposed on the first substrate 100 may be thermally treated at a high temperature under an oxygen atmosphere to improve crystal quality. The gallium oxide layer 105 is formed based on $Ga_2O_3$. Also, the gallium oxide layer 105 may be formed of a mixture or compound in which Al and In, or other elements are mixed with each other within a range in which the crystallographic cleavage characteristic is maintained.

A nitride semiconductor layer including a first conductive type semiconductor layer 110, an active layer 120, and a second conductive type semiconductor layer 130 is formed on the gallium oxide layer 105.

The first conductive type semiconductor layer 110 can be a N-type semiconductor layer or a P-type semiconductor layer. Also, the second conductive type semiconductor layer 130 can be a P-type semiconductor layer or a N-type semiconductor layer. A second semiconductor layer of first conductive type 110 can be formed on the conductive type semiconductor layer 130, and thereby the light emitting structure can be a NPN type or PNP type.

The forming of the nitride semiconductor layer on the gallium oxide layer 105 or a gallium oxide substrate may further include performing a nitridation process on a surface of the gallium oxide layer 105 at a high temperature using an ammonia gas. When the nitridation process is performed, the ammonia gas supplying nitrogen atoms may be provided as a mixed gas mixed with a carrier gas such as hydrogen, nitrogen, or oxygen.

The high-temperature nitridation process may be performed to form a gallium oxynitride layer (not shown) on a surface of the gallium oxide layer 105. The gallium oxynitride layer may serve as a buffer layer of a nitride semiconductor layer to be grown later, and makes it possible to form a high-quality nitride semiconductor layer on the gallium oxide layer 105. At this time, the electrical conductivity of the gallium oxynitride layer can be improved by supplying a silicon-containing gas such as silane gas to the gas injected into the chamber.

Thereafter, a first conductive type semiconductor layer 110 is formed on the gallium oxide layer 105. For example, the first conductive type semiconductor layer 110 may be formed using a chemical vapor deposition (CVD) process, a molecular beam epitaxy (MBE) process, a sputtering process, or a hydride vapor phase epitaxial (HVPE) deposition process. Also, silane gas ($SiH_4$) containing N-type impurities such as trimethylgallium gas (TMGa), ammonia gas ($NH_3$), nitrogen gas ($N_2$), hydrogen gas ($H_2$), and silicon (Si) may be injected into a chamber to form the first conductive type semiconductor layer 110.

The first conductive type semiconductor layer 110 may be formed of one or more of GaN, InN, AlN, InGaN, AlGaN, InAlGaN, AlInN, AlGaAs, AlInGaAs, GaP, AlGaP, InGaP, AlInGaP, and InP.

An active layer 120 is formed on the first conductive type semiconductor layer 110. The active layer 120 severs as a layer in which electrons injected through the first conductive type semiconductor layer 110 recombine with electron holes injected through a second conductive type semiconductor layer 130 to emit light having an energy determined by a proper energy band of an active layer (light emitting layer) material.

The active layer 120 may have at least one structure of a single quantum-well structure, a multi quantum-well structure, a quantum-wire structure, and a quantum dot structure. For example, in the active layer 120, trimethyl gallium (TMGa) gas, ammonia ($NH_3$) gas, nitrogen ($N_2$) gas, and trimethyl indium (TMIn) gas are injected to form the multiquantum well structure, but is not limited thereto.

The active layer 120 may have one or more structures of an InGaN/GaN structure, an InGaN/InGaN structure, an AlGaN/GaN structure, an InAlGaN/GaN structure, a GaAs/AlGaAs (InGaAs) structure, and a GaP/AlGaP(InGaP) structure.

Thereafter, a second conductive type semiconductor layer 130 is formed on the active layer 120. For example, bis (ethylcyclopentadienyl) magnesium (EtCp2Mg){Mg ($C_2H_5C_5H_4$)2} containing p-type impurities such as trimethyl gallium (TMGa) gas, ammonia ($NH_3$) gas, nitrogen ($N_2$) gas, and magnesium (Mg) may be injected into the chamber to form a p-type GaN layer of the second conductive type semiconductor layer 130, but is not limited thereto.

A second electrode layer 140 may be formed on the second conductive type semiconductor layer 130.

The second electrode layer 140 may include an ohmic layer 142, a reflective layer (not shown), an adhesive layer (not shown), and a second substrate 144. The second electrode layer 140 may be formed of at least one of titanium (Ti), chrome (Cr), nickel (Ni), aluminum (Al), platinum (Pt), gold (Au), and tungsten (W).

For example, the second electrode layer 140 may include the ohmic layer 142. At this time, a single metal or a metal alloy may be multi-stacked to improve the efficiency of electron hole injection. The ohmic layer 142 may be formed of at least one of ITO, IZO(In—ZnO), GZO(Ga—ZnO), AZO (Al—ZnO), AGZO(Al—Ga ZnO), IGZO(In—Ga ZnO), IrOx, RuOx, RuOx/ITO, Ni/IrOx/Au, Ni/IrOx/Au/ITO, Ni, Pt, Cr, Ti, and Ag, but is not limited thereto.

Also, the second electrode layer 140 may include a reflective layer (not shown) or an adhesion layer (not shown). For example, the second electrode layer 140 may include a metal layer containing Al, Ag, or an alloy containing Al or Ag. The material such as Al or Ag may effectively reflect light generated at the active layer to improve light extraction efficiency of the LED. Also, for example, when the second electrode layer 140 includes an adhesive layer, the reflective layer may serve as the adhesive layer, or the adhesive layer may be formed using Ni or Au.

The second electrode layer 140 may include a second substrate 144. The second substrate 144 may be formed of a metal having good conductive properties, a metal alloy, or a conductive semiconductor material to efficiently inject carriers. For example, the second substrate 144 may be formed of one of more of copper (Cu), a Cu alloy, Si, molybdenum (Mo), SiGe, Ge, GaN, and SiC. The second substrate 144 may be formed using an electrochemical metal deposition method or a bonding method using eutectic metals.

As shown in FIG. 3, a temperature of a sample increases to about 200° C. to about 900° C. using a rapid thermal processing equipment, and then, the sample is quickly cooled again. The cooling speed may be over about 50° C. per at least minute. The gallium oxide layer 105 may have a thermal expansion coefficient of about $8.2 \times 10-6/°$ C./° C. to about $8.5 \times 10-6/°$ C., and a gallium nitride material may have a thermal expansion coefficient of about $5.7 \times 10-6/°$ C. Thus, the rapid thermal process causes a stress on an interface between the gallium oxide layer 105 and the first conductive type semiconductor layer 110 that is a nitride semiconductor due to a thermal expansion coefficient difference between the materials. Such the stress causes thin film separation along a cleavage plane of the gallium oxide layer 105 disposed on the interface.

When the thermal treatment temperature is greater than about 900° C., the nitride semiconductor thin film may be deformed in quality, and the second electrode layer 140 may be collapsed. When the thermal treatment temperature is less than about 200° C., the stress is very small, and thus, it may be difficult to effectively cause the thin film separation. When the first substrate 100 is separated using the above-described method, the first conductive type semiconductor layer 110 that is an electron transport layer nitride semiconductor thin film is exposed.

As shown in FIG. 4, a wet etching process may be performed on the exposed first conductive type semiconductor layer 110 using a pattern mask as an etch mask to form a surface roughness R. Since the first conductive type semiconductor layer 110 is polarized by nitrogen, the wet etching process may be performed to form the roughness R on a surface of the first conductive type semiconductor layer 110. The roughness R may effectively improve light extraction performance of the LED.

As shown in FIG. 5, the pattern mask 310 is removed. A first electrode 150 may be formed on the exposed first conductive type semiconductor layer 110 to fabricate the LED. At this time, the surface of the exposed first conductive type semiconductor layer 110 is wet-etched to form the first electrode 150. Since the gallium oxide material remaining on the surface of the exposed first conductive type semiconductor layer 110 may reduce an ohmic characteristic, an acid cleaning process may be performed to remove the remaining gallium oxide material.

According to the method for fabricating the LED according to this embodiment, a method for effectively separating the nitride semiconductor thin film from the substrate is provided.

Also, according to the method for fabricating the LED according to this embodiment, since the thin film is separated using the proper cleavage characteristic of a crystal material of gallium oxide, a high-quality nitride semiconductor thin film having economical, simplified, and mass-productive characteristics may be fabricated.

Also, the nitride semiconductor LED fabricated using the method for fabricating the LED according to this embodiment may be greatly contributed in realization of a vertical type nitride semiconductor LED having high power, high efficiency, and high reliability.

(Second Embodiment)

FIG. 6 is a sectional view of a light emitting device (LED) according to a second embodiment.

In an LED according to a second embodiment, a first conductive type semiconductor layer 110, an active layer 120, and a second conductive type semiconductor layer 130 may be disposed on a conductive substrate 200. Non-described numerals will be described in the following fabrication method.

The second embodiment may adopt the technical features of the first embodiment.

A method for fabricating an LED according to second embodiment will be described with reference to FIGS. 7 to 10.

Like the first embodiment and FIG. 7, a gallium oxide layer 105 is formed on a first substrate 100. A first conductive type semiconductor layer 110, an active layer 120, and a second conductive type semiconductor layer 130 are formed on the gallium oxide layer 105.

Thereafter, a non-conductive substrate 210 is formed on the second conductive type semiconductor layer 130. For example, the non-conductive substrate 210 that is a temporary support substrate is attached to the second conductive type semiconductor layer 130 that is a hole injection layer. A sapphire substrate may be used as the temporary support substrate. The non-conductive substrate 210 that is the temporary support substrate may be physically fixed using a fixing pin or fixed using a polymer adhesive material.

As shown in FIG. 8, a temperature of a sample increases to about 200° C. to about 900° C. using a rapid thermal processing equipment, and then, the sample is quickly cooled again. The rapid thermal process causes a stress on an interface between the gallium oxide layer 105 and the first conductive type semiconductor layer 110 that is a nitride semiconductor due to a thermal expansion coefficient difference between the materials. Such the stress causes thin film separation along to (100) or (001) plane of the gallium oxide layer 105 disposed on the interface. As a result, the gallium oxide layer 105 may be separated, and the first conductive type semiconductor layer may be exposed.

As shown in FIG. 9, a first electrode layer 115 may be formed on the exposed first conductive type semiconductor layer 110. The first electrode layer 115 may include an ohmic layer, a reflective layer, and an adhesive layer.

A conductive substrate 200 is formed on the first conductive type semiconductor layer 110 or the first electrode layer 115. The conductive substrate 200 may be formed of a metal having thermally good conductivity or a semiconductor material. When the conductive substrate 200 is formed, a eutectic metal for bonding may be used.

As shown in FIG. 10, the non-conductive substrate 210 that is the temporary support substrate may be removed to form a second electrode 270 on the second conductive type semiconductor layer 130.

(Third Embodiment)

FIGS. 11 to 12 are sectional views of a method for fabricating an LED according to a third embodiment.

The third embodiment relates to a method for separating a nitride semiconductor layer 125 from a gallium oxide layer 105 when the nitride semiconductor layer 125 is formed on the gallium oxide layer 105 in a single layer. For example, the nitride semiconductor layer 125 may be a GaN semiconductor layer, but is not limited thereto.

For example, as shown in FIG. 11, the nitride semiconductor layer 125 may be formed on the gallium oxide layer 105 as a thicker electron transport single layer having a thickness of about 70 μm. The nitride semiconductor layer 125 may be deposited using a chemical vapor deposition method or a hydride vapor phase epitaxy method.

According to the third embodiment, when the nitride semiconductor layer 125 is formed as a thicker single layer, the nitride semiconductor layer 125 may be separated through the following processes.

For example, as shown in FIG. 12, a thin film of the nitride semiconductor layer 125 is grown within a thin film growth equipment. Thereafter, when the thin film growth equipment is cooled, the thin film growth equipment is quickly cooled to self-separate the nitride semiconductor layer 125 from the gallium oxide layer 105.

The gallium oxide layer 105 may have a thermal expansion coefficient of about $8.2 \times 10-6/°$ C./° C. to about $8.5 \times 10-6/°$ C., and a gallium nitride material may have a thermal expansion coefficient of about $5.7 \times 10-6/°$ C. Thus, when the thin film growth equipment is quickly cooled after the thin film is grown, a stress occurs on an interface between the gallium oxide layer 105 and the nitride semiconductor layer 125 due to a thermal expansion coefficient difference between the materials. Such the stress causes thin film separation along a cleavage plane of the gallium oxide layer 105 disposed on the interface.

At this time, the nitride semiconductor layer 125 may have a thickness of at least about 70 μm. When the nitride semiconductor layer 125 does not have a sufficiently thicker thickness, the thin film may be self-separated. As a result, the thin film may not be maintained in its original shape and broken. The cooling speed may be over about 50° C. per at least minute. The separated nitride semiconductor layer 125 may have electrical conductivity, and be uses as a substrate of the LED.

The LED according to an embodiment may be applicable to a lighting system. The lighting system may include a lighting unit and a backlight unit. In addition, the lighting system may be applicable to traffic lights, a vehicle headlight, and a sign.

Any reference in this specification to "one embodiment," "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for fabricating a light emitting device (LED), the method comprising:
    forming a gallium oxide layer;
    forming a light emitting structure on the gallium oxide layer, wherein the light emitting structure comprises a first conductive type semiconductor layer, an active layer, and a second conductive type semiconductor layer;
    forming a non-conductive substrate on the light emitting structure;
    separating the gallium oxide layer from the light emitting structure after forming non-conductive substrate;
    forming a conductive substrate on the light emitting structure; and
    separating the non-conductive substrate from the light emitting structure after forming the conductive substrate.

2. The method of claim 1, wherein the separating of the gallium oxide layer comprises:
    heating the gallium oxide layer at a temperature of about 200° C. to about 900° C.; and quickly cooling the gallium oxide layer.

3. The method of claim 1, wherein, in the separating of the gallium oxide layer, the first conductive type semiconductor layer comprises a first conductive type GaN semiconductor layer, and the gallium oxide layer is separated by an interface stress due to a thermal expansion coefficient difference between the gallium oxide layer and the first conductive type GaN semiconductor layer.

4. The method of claim 3, wherein, in the separating of the gallium oxide layer, the gallium oxide layer has a thermal expansion coefficient of about $8.2 \times 10^{-6}/°$ C./° C. to about $8.5 \times 10^{-6}/°$ C., and the first conductive type GaN semiconductor layer has a thermal expansion coefficient of about $5.7 \times 10^{-6}/°$ C.

5. The method of claim 1, wherein, in the separating of the gallium oxide layer, the gallium oxide layer is cleaved along a (100) or (001) plane.

6. The method of claim 1, further comprising:
    performing a nitridation process on a surface of the gallium oxide layer before forming the light emitting structure.

7. The method of claim 6, wherein the nitridation process includes supplying a silicon-containing gas to a carrier gas.

* * * * *